United States Patent
Terasawa

[11] Patent Number: 5,847,417
[45] Date of Patent: Dec. 8, 1998

[54] SEMICONDUCTOR DEVICE AND METHOD OF MANUFACTURING SAME

[75] Inventor: Yoshio Terasawa, Hitachinaka, Japan

[73] Assignee: NGK Insulators, Ltd., Nagoya, Japan

[21] Appl. No.: 516,405

[22] Filed: Aug. 17, 1995

[30] Foreign Application Priority Data

Aug. 26, 1994 [JP] Japan ................... 6-202546

[51] Int. Cl.$^6$ .................. H01L 29/74; H01L 29/80
[52] U.S. Cl. ................ 257/135; 257/331; 257/334; 257/263; 257/265
[58] Field of Search .................. 257/134, 135, 257/136, 328, 329, 330, 331, 334, 263, 264, 265

[56] References Cited

U.S. PATENT DOCUMENTS 4,198,645   4/1980   Nishizawa ................... 257/41

FOREIGN PATENT DOCUMENTS

| 0 022 483 A1 | 1/1981 | European Pat. Off. | 257/138 |
| 0141538 | 5/1985 | European Pat. Off. | 257/135 |
| 0 190 508 A2 | 8/1986 | European Pat. Off. | 257/135 |
| 0 663 698 A1 | 7/1995 | European Pat. Off. | 257/135 |
| 0 687 015 A2 | 12/1995 | European Pat. Off. | 25/135 |
| 57-9226 | 2/1982 | Japan . |  |
| 57-88771 | 6/1982 | Japan | 257/135 |
| 59-17547 | 4/1984 | Japan . |  |
| 59-143363 | 8/1984 | Japan | 257/135 |
| 60-5064 | 2/1985 | Japan . |  |

OTHER PUBLICATIONS

Patent Abstract of Japan; Publication No. 62 62558 A;Date: 03/19/87; Ogura Tsuneo et al.

*Primary Examiner*—Donald Monin
*Attorney, Agent, or Firm*—Kubovcik & Kubovcik

[57] ABSTRACT

A normally-off semiconductor device with gate regions formed in a high-quality base is manufactured by forming a P$^+$ layer in a lower surface of an N$^-$ substrate, selectively forming P$^+$ gate regions in an upper surface of the N$^-$ substrate, forming intergate P$^+$ regions in the upper surface of the N$^-$ substrate between the P$^+$ gate regions, forming an N$^+$ layer in an upper surface of an N$^-$ substrate, joining the N$^-$ substrate and the N$^-$ substrate to each other by heating them at about 800° C. in a hydrogen atmosphere while the upper surface of the N$^-$ substrate and a lower surface of the N$^-$ substrate are being held against each other, and forming an anode electrode and a cathode electrode.

6 Claims, 11 Drawing Sheets

SEMICONDUCTOR DEVICE AND METHOD OF MANUFACTURING SAME

BACKGROUND OF THE INVENTION

1. Field of the Invention

The present invention relates to a semiconductor device and method of manufacturing such a semiconductor device, and more particularly to a normally-off static induction thyristor and a method of manufacturing such a normally-off static induction thyristor.

2. Description of the Related Art

Figure 1:
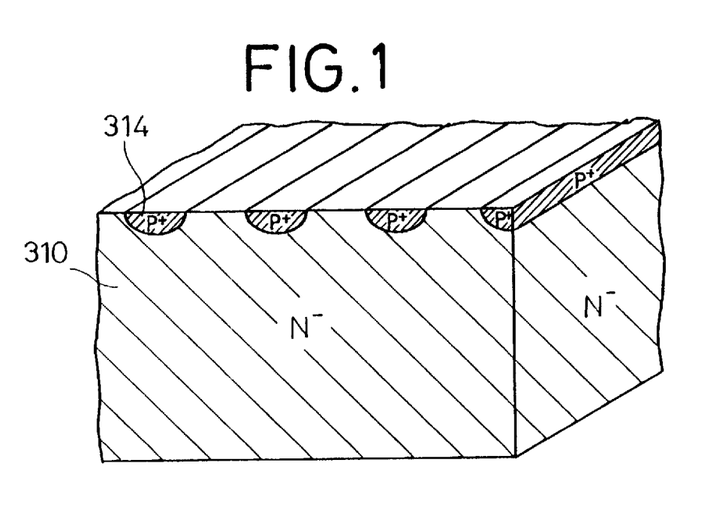
FIGS. 1 through 3 are fragmentary perspective cross-sectional views showing a conventional static induction thyristor and a method of manufacturing the conventional static induction thyristor.
Figure 2:
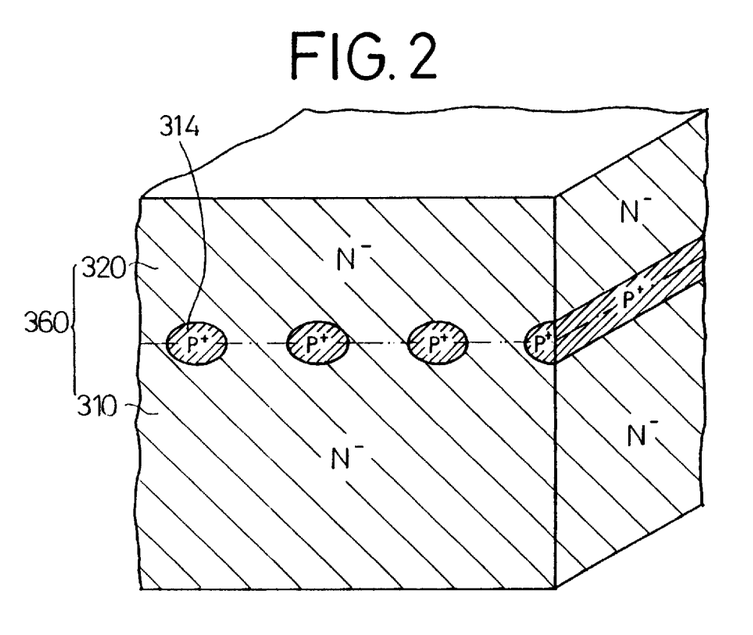
Figure 3:
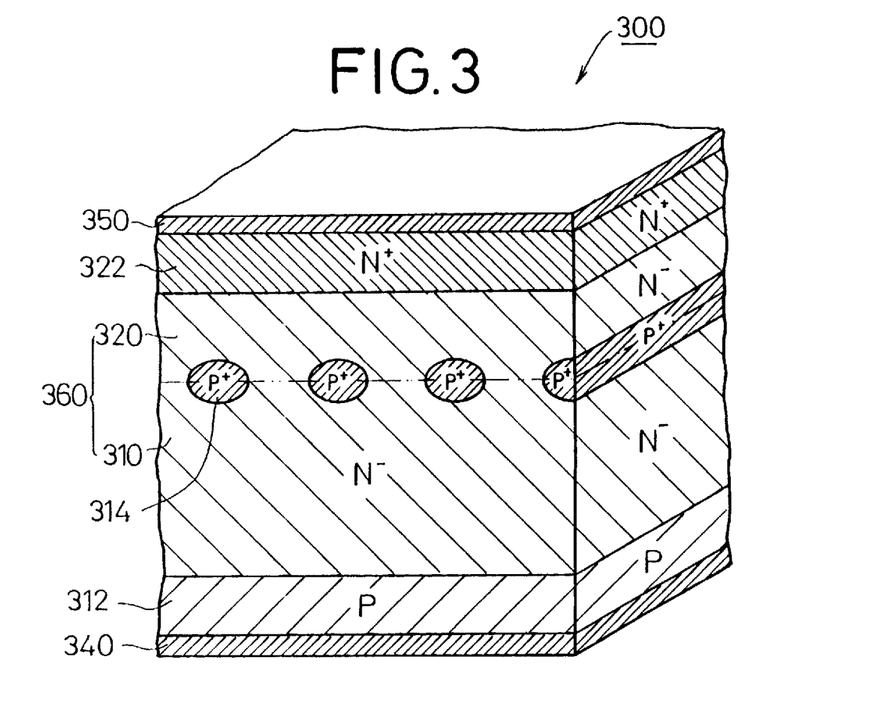

FIGS. 1 through 3 of the accompanying drawings are illustrative of a conventional static induction thyristor 300 and a method of manufacturing the conventional static induction thyristor 300.

Heretofore, the conventional static induction thyristor 300 has been manufactured as follows:

First, as shown in FIG. 1, a P-type impurity is selectively diffused into one principal surface, i.e., an upper surface, of an $N^-$ substrate 310 to selectively form $P^+$ gate regions 314.

Then, as shown in FIG. 2, an $N^-$ epitaxial layer 320 is deposited on the $N^-$ substrate 310 by chemical vapor deposition. At this time, $P^+$ gate regions 314 are also formed in the $N^-$ epitaxial layer 320 by automatic doping.

Thereafter, as shown in FIG. 3, a P layer 312 is formed in a lower surface of the $N^-$ substrate 310 by diffusing an impurity therein, and an $N^+$ layer 322 is formed in the upper surface of the $N^-$ epitaxial layer 320 by diffusing an impurity therein.

Then, an anode electrode 340 is deposited on a lower surface of the P layer 312, and a cathode electrode 350 is deposited on an upper surface of the $N^+$ layer 322.

In the static induction thyristor 300 thus formed, the P layer 312 functions as an anode, the $N^+$ layer 322 as a cathode, both the $N^-$ substrate 310 and the $N^-$ epitaxial layer 320 as an N base 360, and the $P^+$ gate regions 314 as a gate for controlling an anode current flowing between the anode electrode 340 and the cathode electrode 350.

In order to increase a maximum cutoff current, the conventional static induction thyristor 300 has the $P^+$ gate regions 314 of a high impurity concentration embedded in the N base 360. To embed the $P^+$ gate regions 314 in the N base 360, it is necessary to selectively form $P^+$ gate regions 314 in one principal surface of the $N^-$ substrate 310, as shown in FIG. 1, and thereafter to form the $N^-$ epitaxial layer 320 on the $N^-$ substrate 310 by way of chemical vapor deposition.

Since the $N^-$ epitaxial layer 320 is formed on the $N^-$ substrate 310 after the $P^+$ gate regions 314 have selectively been formed in the $N^-$ substrate 310, the $N^-$ epitaxial layer 320 grown on the $P^+$ gate regions 314 tend to suffer crystal defects such as stacking faults. Therefore, it has been difficult to produce an $N^-$ epitaxial layer 320 of high quality, and hence it has also been difficult to produce an N base 360 of high quality.

Inasmuch as the impurity of the $P^+$ gate regions 314 affects the crystallinity of the $N^-$ epitaxial layer 320, a certain limitation is posed on the impurity concentration of the $P^+$ gate regions 314. As a result, it has not been possible to increase the maximum cutoff current beyond a certain limit.

To manufacture a conventional normally-off static induction thyristor 400 (see FIG. 6 of the accompanying drawings) from the conventional static induction thyristor 300 according to the method of manufacturing the conventional static induction thyristor 300, it is proposed to form $P^+$ regions 315 (see FIG. 4 of the accompanying drawings) between the $P^+$ gate regions 314.

Figure 4:
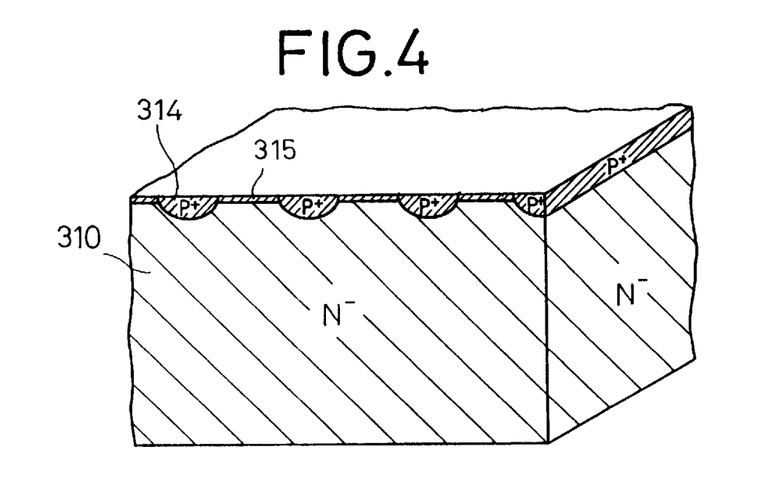
FIGS. 4 through 6 are fragmentary perspective cross-sectional views showing a conventional normally-off static induction thyristor and a method of manufacturing the conventional normally-off static induction thyristor.
Figure 5:
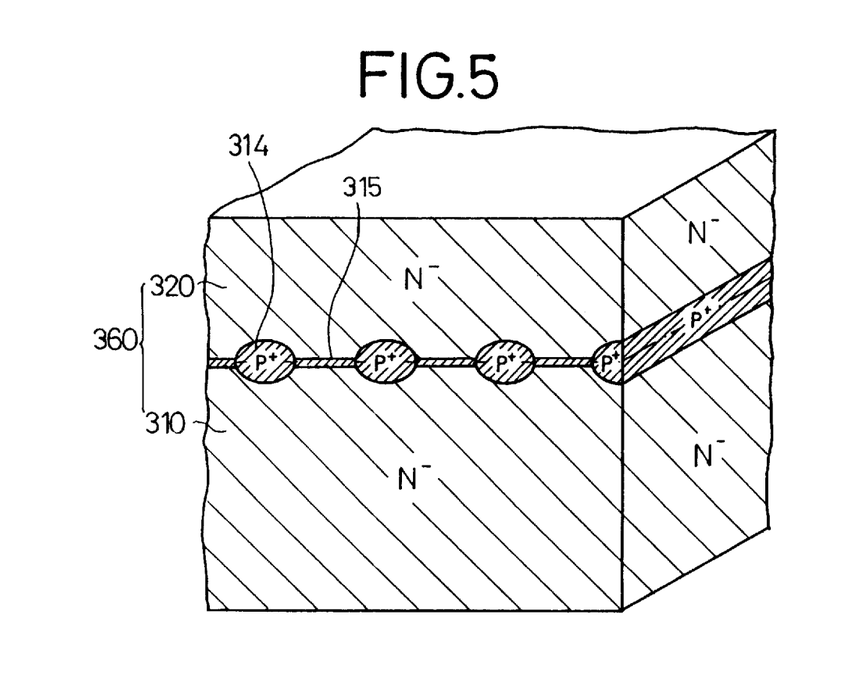
Figure 6:
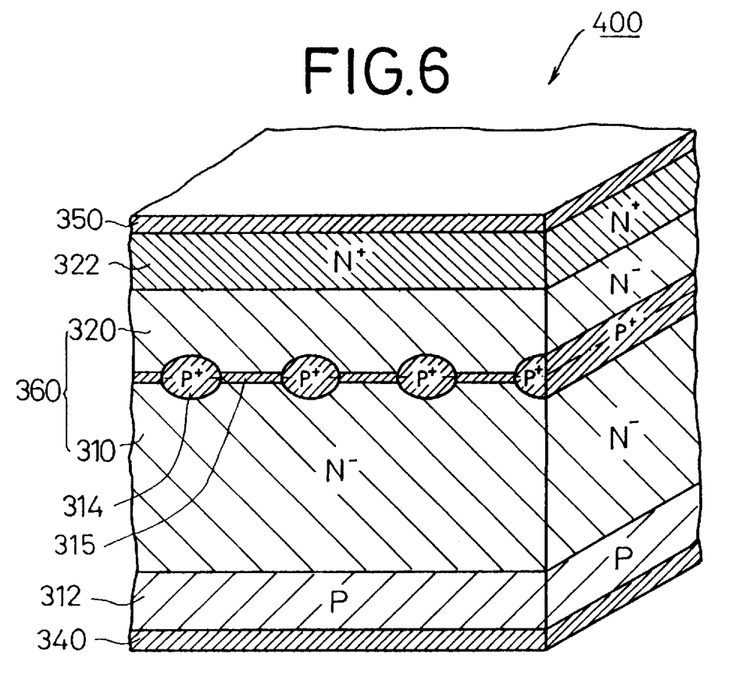

FIGS. 4 through 6 of the accompanying drawings are illustrative of a method of manufacturing such a conventional normally-off static induction thyristor 400 according to the method of manufacturing the conventional static induction thyristor 300.

First, as shown in FIG. 4, a P-type impurity is selectively diffused into one principal surface, i.e., an upper surface, of an $N^-$ substrate 310 to selectively form $P^+$ gate regions 314. A P-type impurity is also selectively diffused into the principal surface of the $N^-$ substrate 310 to form $P^+$ regions 315 between the $P^+$ gate regions 314.

Then, as shown in FIG. 5, an $N^-$ epitaxial layer 320 is deposited on the $N^-$ substrate 310 by chemical vapor deposition. At this time, $P^+$ gate regions 314 and $P^+$ regions 315 are also formed in the $N^-$ epitaxial layer 320 by automatic doping.

Thereafter, as shown in FIG. 6, a P layer 312 is formed in a lower surface of the $N^+$ substrate 310 by diffusing an impurity therein, and an $N^+$ layer 322 is formed in the upper surface of the $N^-$ epitaxial layer 320 by diffusing an impurity therein.

Then, an anode electrode 340 is deposited on a lower surface of the P layer 312, and a cathode electrode 350 is deposited on an upper surface of the $N^+$ layer 322.

In the static induction thyristor 400 thus formed, the P layer 312 functions as an anode, the $N^+$ layer 322 as a cathode, both the $N^-$ substrate 310 and the $N^-$ epitaxial layer 320 as an N base 360, and the $P^+$ gate regions 314 as a gate for controlling an anode current flowing between the anode electrode 340 and the cathode electrode 350. Since the $P^+$ regions 315 are formed between the $P^+$ gate regions 314, a depletion layer is formed contiguously between the $P^+$ gate regions 314 even when no bias is applied to the gate. Therefore, the static induction thyristor 400 functions as a normally-off static induction thyristor.

The normally-off static induction thyristor 400 manufactured according to the above process suffers problems, described below, in addition to the problems posed by the manufacture of the conventional static induction thyristor 300.

In the normally-off static induction thyristor 400, not only the $P^+$ gate regions 314 of high impurity concentration, but also the $P^+$ regions 315 are embedded in the N base 360. To embed the $P^+$ gate regions 314 and the $P^+$ regions 315 in the N base 360, it is necessary to selectively form $P^+$ gate regions 314 and $P^+$ regions 315 in one principal surface of the $N^-$ substrate 310, as shown in FIG. 4, and thereafter to form the $N^-$ epitaxial layer 320 on the $N^-$ substrate 310 by way of chemical vapor deposition.

Since the $N^-$ epitaxial layer 320 is formed on the $N^-$ substrate 310 after the $P^+$ gate regions 314 and the $P^+$ regions 315 have been formed in the $N^-$ substrate 310, the $N^-$ epitaxial layer 320 grown on the $P^+$ gate regions 314 and the $P^+$ regions 315 tend to suffer crystal defects such as stacking faults. Therefore, it has been difficult to produce an $N^-$ epitaxial layer 320 of high quality not only on the $P^+$ gate regions 314 but also between the $P^+$ gate regions 314, and it has also been difficult to produce an N base 360 of high quality.

Inasmuch as the $P^+$ gate regions 314 are formed by diffusing an impurity into one principal surface of the $N^-$ substrate 310, the P+ gate regions 314 have sound side edges. Consequently, depletion layers extending between the P+ gate regions 314 do not extend parallel to the direction of the anode current flowing between the anode and the cathode, with the result that a large current cannot be controlled by the gate.

SUMMARY OF THE INVENTION

It is a general object of the present invention to provide a method of manufacturing a normally-off static induction thyristor having gate regions formed in a high-quality base.

Another object of the present invention is to provide a normally-off static induction thyristor capable of controlling a large current and a method of manufacturing such a normally-off static induction thyristor.

Still another object of the present invention is to provide a normally-off static induction thyristor which has uniform and high-quality crystallinity, allows gate regions to be doped with an impurity of high concentration, and is almost free of impurity diffusion, and a method of manufacturing such a normally-off static induction thyristor.

Yet still another object of the present invention is to provide a semiconductor device which has a high dielectric strength when turned off, suffers a low leakage current, has an excellent cutoff capability, and is capable of controlling a large current, and a method of manufacturing such a semiconductor device.

A further object of the present invention is to provide a semiconductor device which can operate in a high frequency range, permits a carrier drawing current to be increased, and is capable of high-speed switching operation, and a method of manufacturing such a semiconductor device.

According to the present invention, there is provided a method of manufacturing a semiconductor device, comprising the steps of preparing first and second semiconductor substrates of one conductivity type, forming gate regions made of a semiconductor of another conductivity type in one principal surface of the first semiconductor substrate, forming a first semiconductor region of the other conductivity type in the one principal surface of the first semiconductor substrate between the gate regions, and joining the one principal surface of the first semiconductor substrate between the gate regions and one principal surface of the second semiconductor substrate.

According to the present invention, there is provided a semiconductor device comprising an anode electrode, a cathode electrode, a semiconductor substrate disposed between the anode electrode and the cathode electrode, a gate disposed in the semiconductor substrate for controlling a current flowing between the anode electrode and the cathode electrode, the semiconductor substrate having cavities defined therein, gate regions of a semiconductor disposed on regions of the semiconductor substrate which are exposed on side walls of the cavities, and a semiconductor region of the same conductivity type as the gate regions, which is disposed between the gate regions such that a depletion layer is continuously spread between the gate regions when no bias is applied to the gate.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS (1st Embodiment)

FIGS. 7A through 7D are illustrative of a static induction thyristor according to a first embodiment of the present invention and a method of manufacturing the static induction thyristor according to the first embodiment.

Figure 7A:
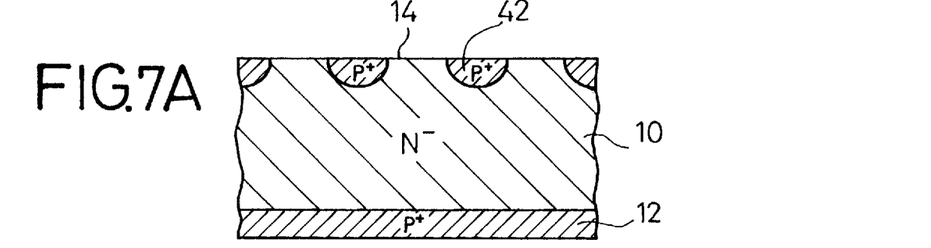
FIGS. 7A through 7D are fragmentary cross-sectional views showing a static induction thyristor according to a first embodiment of the present invention and a method of manufacturing the static induction thyristor according to the first embodiment.

First, N− substrates 10, 20 having respective mirror-finished surfaces to be joined to each other are prepared.

Then, as shown in FIG. 7A, a P+ layer 12 is formed in a lower surface of the N− substrate 10 by diffusing an impurity therein, and thereafter P+ gate regions 42 are selectively formed in an upper surface 14 of the N− substrate 10 by selectively diffusing a P-type impurity of boron therein.

Figure 7B:
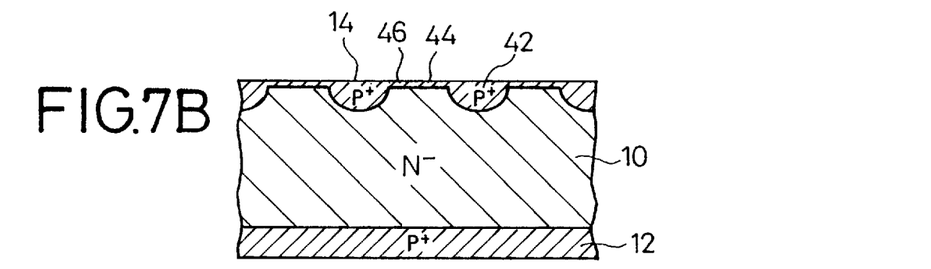

Then, as shown in FIG. 7B, a P-type impurity of boron is diffused to form a P+ gate region 44 in the entire upper surface 14 of the N− substrate 10, thereby forming intergate P+ regions 46 in upper surface 14 of the N− substrate 10 between the P+ gate regions 42. The intergate P+ regions 46 are contiguous to the P+ gate regions 42.

Figure 7C:
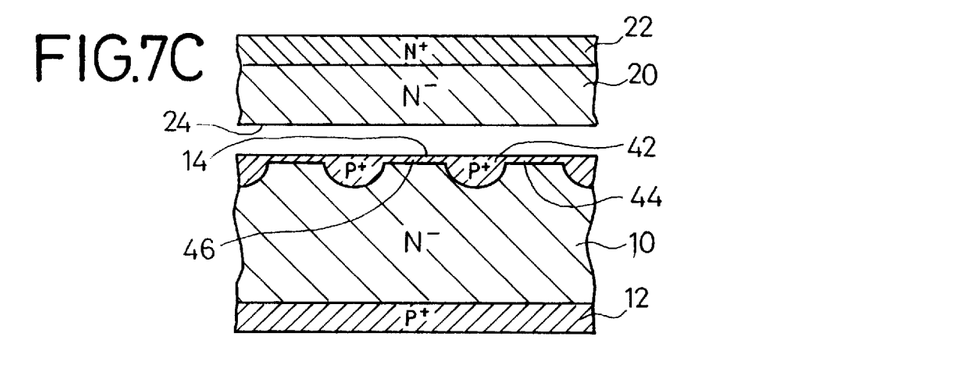

As shown in FIG. 7C, an N+ layer 22 is formed in an upper surface of the N− substrate 20 by diffusing an impurity therein.

Then, the N− substrates 10, 20 are ultrasonically cleaned with an aqueous solution of sulfuric acid and hydrogen peroxide, thereby removing organic substances and metals.

Thereafter, the N⁻ substrates 10, 20 are cleaned with pure water, and dried by a spinner at room temperature.

Figure 7D:
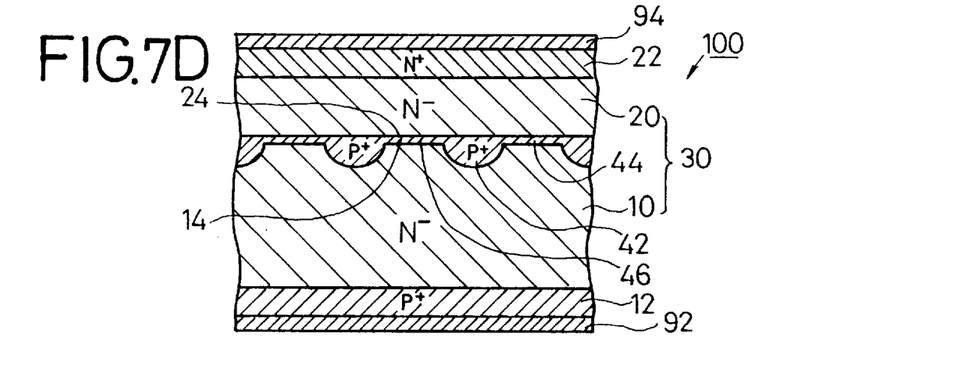

As shown in FIG. 7D, while the upper surface 14 of the N⁻ substrate 10 and a lower surface 24 of the N⁻ substrate 20 are being held against each other, the N⁻ substrate 10 and the N⁻ substrate 20 are joined to each other by being heated at about 800° C. in a hydrogen atmosphere.

Then, an anode electrode 92 and a cathode electrode 94 are formed respectively on a lower surface of the P⁺ layer 12 formed in the lower surface of the N⁻ substrate 10 and an upper surface of the N⁺ layer 22 formed the upper surface of the N⁻ substrate 20, thus producing a static induction thyristor 100.

In the static induction thyristor 100, the P⁺ layer 12 functions as an anode, the N⁺ layer 22 as a cathode, both the N⁻ substrates 10, 20 as an N base 30, and the P⁺ gate regions 42 as a gate for controlling an anode current flowing between the anode electrode 92 and the cathode electrode 94.

In this embodiment, since the N base 30 in which the P⁺ gate regions 42 and the intergate P⁺ regions 46 embedded is formed by joining the N- substrates 10, 20 to each other, the N base 30 has uniform, high-quality crystallinity. Inasmuch as the entire upper surface 14 of the N⁻ substrate 10 is composed of the P⁺ layer, the upper surface 14, including the P⁺ gate regions 42, is uniformly joined in its entirely to the N⁻ substrate 20. Because both the P⁺ gate regions 42 and the intergate P⁺ regions 46 are of the P-type, they can be manufactured in a simple process. It is possible to make the P⁺ gate regions 42 of high concentration for increasing a maximum cutoff current.

According to this embodiment, the intergate P⁺ regions 46 are formed between the P⁺ gate regions 42 contiguously thereto. Therefore, even when no bias is applied to the gate, a depletion layer is continuously spread between the P⁺ gate regions 42, so that the static induction thyristor 100 functions as a normally-off static induction thyristor.

While the N⁻ substrate 10 and the N⁻ substrate 20 are joined to each other by being heated at about 800° C. in this embodiment, they may be joined to each other at a temperature equal to or higher than about 400° C. However, if they were heated at a temperature equal to or higher than about 1100° C., then the impurities in the P+gate regions 42 and the intergate P⁺ regions 46 would be diffused into the N⁻ substrate 10 and the N⁻ substrate 20, adversely affecting the characteristics of the thyristor. Preferably, the N⁻ substrate 10 and the N⁻ substrate 20 should be joined at a temperature ranging from about 700 to 1100° C. under normal pressure because any thermal diffusion of impurities is minimum and strains of joined crystal lattices are small in such a temperature range.

In the embodiment, the N⁻ substrate 10 and the N⁻ substrate 20 are joined to each other without any pressure applied to opposite sides thereof. However, it is preferable to join the N⁻ substrate 10 and the N⁻ substrate 20 to each other while applying a pressure to opposite sides thereof because the application of a pressure lowers the temperature at which the N⁻ substrate 10 and the N⁻ substrate 20 are joined, suppresses thermal diffusion of impurities, and reduces non-contact regions between the N⁻ substrate 10 and the N⁻ substrate 20. The applied pressure should preferably be in the range of from 0.1 kg/cm² to 100 kg/cm². If the pressure were lower than 0.1 kg/cm², the N⁻ substrate 10 and the N⁻ substrate 20 would not be sufficiently held in contact with each other. If the pressure were higher than 100 kg/cm², the N⁻ substrate 10 and the N⁻ substrate 20 would be dislocated due to deformation. Under the applied pressure, the temperature at which the N⁻ substrate 10 and the N⁻ substrate 20 are joined should preferably range from about 400 to 1100° C., and more preferably range from about 500 to 1000° C. because the temperature may be lowered by the applied pressure.

(2nd Embodiment)

FIGS. 8A through 8D are illustrative of a static induction thyristor according to a second embodiment of the present invention and a method of manufacturing the static induction thyristor according to the second embodiment.

Figure 8A:
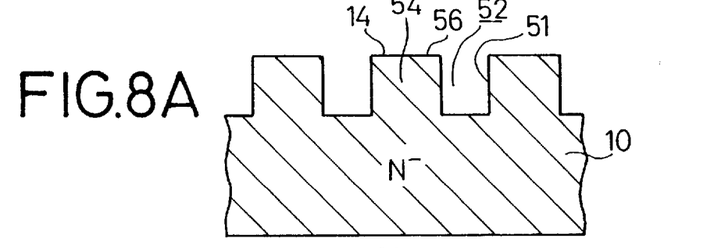
FIGS. 8A through 8D are fragmentary cross-sectional views showing a static induction thyristor according to a second embodiment of the present invention and a method of manufacturing the static induction thyristor according to the second embodiment.

First, N⁻ substrates 10, 20 having respective mirror-finished surfaces to be joined to each other are prepared.

Then, as shown in FIG. 8A, recesses 52 each having a width of about 50 μm and a depth of about 20 μm are defined at a pitch or spacing of about 70 μm in an upper surface 14 of the N⁻ substrate 10 according to photolithography, leaving lands 54 between the recesses 52. Each of the recesses 52 has side walls 51 extending substantially perpendicularly to the upper surface 14 of the N⁻ substrate 10.

Figure 8B:
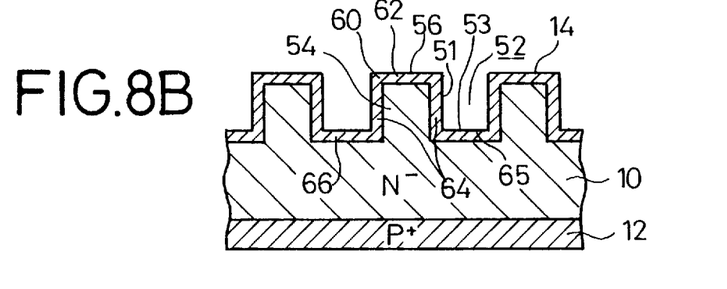

Then, as shown in FIG. 8B, a P⁺ layer 12 is formed in a lower surface of the N⁻ substrate 10 by diffusing an impurity therein.

Then, a P-type impurity of boron is diffused into the N⁻ substrate 10 from its upper surface 14, forming a P⁺ region 60 in the entire upper surface 14 of the N⁻ substrate 10. When the P⁺ region 60 is formed in the entire upper surface 14, P⁺ side gate regions 64, P⁺ bottom gate regions 66, and intergate P⁺ regions 62 are simultaneously formed. Specifically, the P⁺ side gate regions 64 and the P⁺ bottom gate regions 66 are formed in exposed regions of the N⁻ substrate 10 on the side walls 51 and bottoms 53 of the recesses 52, and the intergate P⁺ regions 62 are formed in exposed regions of the N⁻ substrate 10 on upper surfaces 56 of the lands 54. The P⁺ bottom gate regions 66, the P⁺ side gate regions 64, and the intergate P⁺ regions 62 are contiguous to each other. The P⁺ side gate regions 64 and the P⁺ bottom gate regions 66 jointly constitute P⁺ gate regions 65. The boron is diffused into the N⁻ substrate 10 at a temperature ranging from about 1050 to 1200° C. in an atmosphere of $BBr_3 + O_2$. When the boron is diffused, oxide films (not shown) are formed on the side walls 51 and bottoms 53 of the recesses 52 and also on the upper surfaces 56 of the lands 54.

Figure 8C:
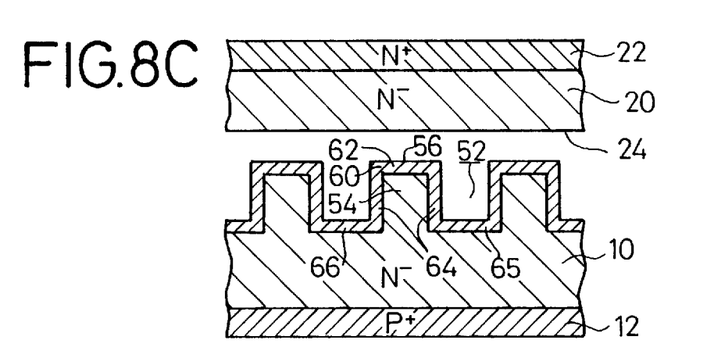

As shown in FIG. 8C, an N⁺ layer 22 is formed in an upper surface of the N⁻ substrate 20 by diffusing an impurity therein.

Then, the N⁻ substrates 10, 20 are ultrasonically cleaned with an aqueous solution of sulfuric acid and hydrogen peroxide, thereby removing organic substances and metals.

Thereafter, the N⁻ substrates 10, 20 are cleaned with pure water, and dried by a spinner at room temperature.

Figure 8D:
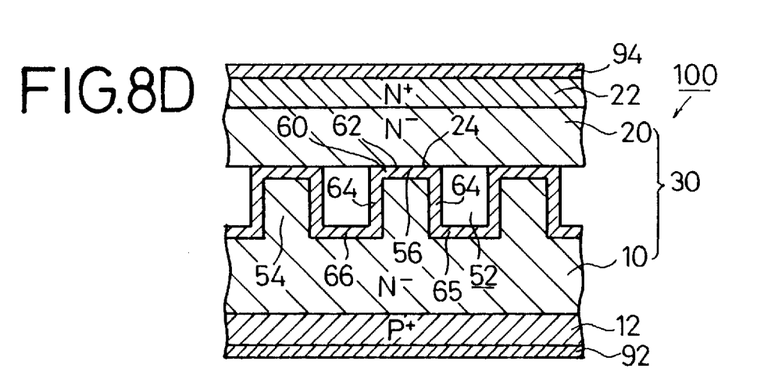

As shown in FIG. 8D, while the upper surfaces 56 of the lands 54 of the N⁻ substrate 10 between the recesses 52 and a lower surface 24 of the N⁻ substrate 20 are being held against each other, and the N⁻ substrate 10 and the N⁻ substrate 20 are joined to each other by being heated at about 800° C. in a hydrogen atmosphere.

Then, an anode electrode 92 and a cathode electrode 94 are formed respectively on a lower surface of the P⁺ layer 12 formed in the lower surface of the N⁻ substrate 10 and an upper surface of the N⁺ layer 22 formed the upper surface of the N⁻ substrate 20, thus producing a static induction thyristor 100.

In the static induction thyristor 100, the P⁺ layer 12 functions as an anode, the N⁺ layer 22 as a cathode, both the N⁻ substrates 10, 20 as an N base 30, and the P⁺ gate regions 65 as a gate for controlling an anode current flowing between the anode electrode 92 and the cathode electrode 94.

In this embodiment, since the N base 30 in which the P$^+$ gate regions 65 and the intergate P$^+$ regions 62 embedded is formed by joining the N$^-$ substrates 10, 20 to each other, the N base 30 has uniform, high-quality crystallinity. It is possible to make the P$^+$ gate regions 65 of high concentration for increasing a maximum cutoff current.

According to this embodiment, the intergate P$^+$ regions 62 are formed between the P$^+$ gate regions 65 contiguously thereto. Therefore, even when no bias is applied to the gate, a depletion layer is continuously spread between the P$^+$ gate regions 65, especially between the side gate regions 64, so that the static induction thyristor 100 functions as a normally-off static induction thyristor.

The recesses 52 defined in the upper surface 14 of the N$^-$ substrate 10 and the lower surface 24 of the N$^-$ substrate 20 jointly create cavities in the N base 30, and the side gate regions 64 are formed on exposed regions of the N$^-$ substrate 10 at the side walls 51 of the recesses 52. Since the anode current flows along the side walls 51 of the recesses 52, the side gate regions 64 formed along the side walls 51 of the recesses 52 increase a channel width, so that the length of the depletion layer which extends from the gate regions 65 when the static induction thyristor is turned off is increased in the direction in which the anode current flows. Therefore, the static induction thyristor 100 has a high dielectric strength when turned off, suffers a low leakage current, has an excellent cutoff capability, and is capable of controlling a large current.

Because the channel width is increased, the static induction thyristor 100 is given desired turn-off characteristics even if the distance between the gate regions 65 is not reduced, and hence it is not necessary to reduce the distance between the recesses 52 in the N$^-$ substrate 10. As a consequence, a yield can be increased at the time the recesses 52 are defined in a fine pattern in the upper surface of the N$^-$ substrate 10.

Since it is not necessary to reduce the distance between the recesses 52 in the N$^-$ substrate 10, the cross-sectional area of the N$^-$ substrate 10 between the recesses 52 is prevented from being reduced, and the resistance of the N$^-$ substrate 10 between the recesses 52 is lowered, with the results that the voltage across the static induction thyristor 100 when it is turned on is lowered, and the static induction thyristor 100 can handle a large current.

With the side walls 51 of the recesses 52 extending substantially parallel to the direction of the anode current flowing between the anode electrode 92 and the cathode electrode 94, the side gate regions 64 extend also substantially parallel to the direction of the anode current. As a result, the depletion layer formed at the time the static induction thyristor 100 is turned off extends uniformly the full length of the channel between the gate regions 65. Consequently, the static induction thyristor 100 has a higher dielectric strength when turned off, suffers a lower leakage current, has a more excellent cutoff capability, and is capable of controlling a larger current.

(3rd Embodiment)

FIGS. 9A through 9D are illustrative of a static induction thyristor according to a third embodiment of the present invention and a method of manufacturing the static induction thyristor according to the third embodiment.

Figure 9A:
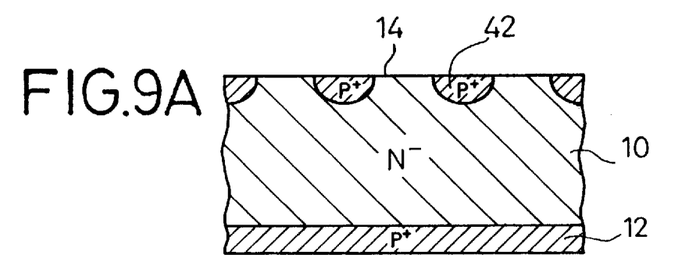
FIGS. 9A through 9D are fragmentary cross-sectional views showing a static induction thyristor according to a third embodiment of the present invention and a method of manufacturing the static induction thyristor according to the third embodiment.
Figure 9B:
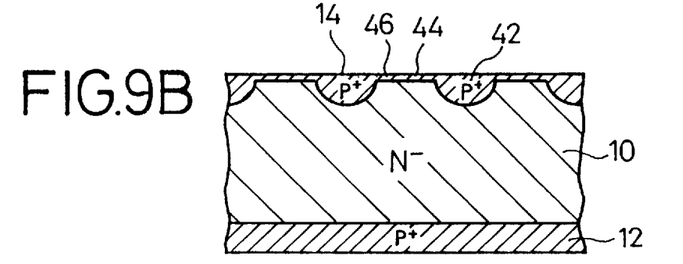

First, as shown in FIGS. 9A and 9B, a P$^+$ layer 12 is formed in a lower surface of the N$^-$ substrate 10, and P$^+$ gate regions 42 and intergate P$^+$ regions 46 are formed in an upper surface 14 of the N$^-$ substrate 10 in the same manner as with the first embodiment. The intergate P$^+$ regions 46 are contiguous to the P$^+$ gate regions 42.

Figure 9C:
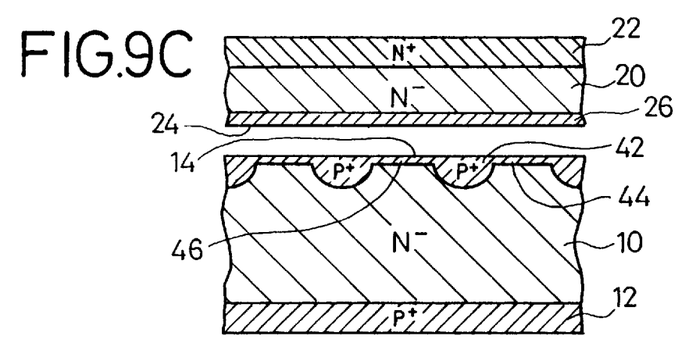

As shown in FIG. 9C, an N$^+$ layer 22 is formed in an upper surface of the N$^-$ substrate 20 by diffusing an impurity therein, and a P$^+$ layer 26 is formed in an entire lower surface 24 of the N$^-$ substrate 20 by diffusing an impurity therein.

Then, the N$^-$ substrates 10, 20 are ultrasonically cleaned with an aqueous solution of sulfuric acid and hydrogen peroxide, thereby removing organic substances and metals.

Thereafter, the N$^-$ substrates 10, 20 are cleaned with pure water, and dried by a spinner at room temperature.

Figure 9D:
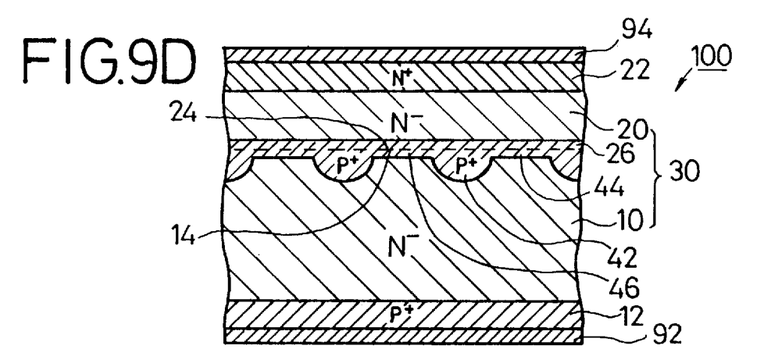

As shown in FIG. 9D, while the upper surface 14 of the N$^-$ substrate 10 and the lower surface 24 of the N$^-$ substrate 20 are being held against each other, and the N$^-$ substrate 10 and the N$^-$ substrate 20 are joined to each other by being heated at about 800° C. in a hydrogen atmosphere.

Then, an anode electrode 92 and a cathode electrode 94 are formed respectively on a lower surface of the P$^+$ layer 12 formed in the lower surface of the N$^-$ substrate 10 and an upper surface of the N$^+$ layer 22 formed the upper surface of the N$^-$ substrate 20, thus producing a static induction thyristor 100.

In the static induction thyristor 100, the P$^+$ layer 12 functions as an anode, the N$^+$ layer 22 as a cathode, both the N$^-$ substrates 10, 20 as an N base 30, and the P$^+$ gate regions 42 as a gate for controlling an anode current flowing between the anode electrode 92 and the cathode electrode 94.

In this embodiment, since the N base 30 in which the P$^+$ gate regions 42 and the intergate P$^+$ regions 46 embedded is formed by joining the N$^-$ substrates 10, 20 to each other, the N base 30 has uniform, high-quality crystallinity. Inasmuch as the entire upper surface 14 of the N$^-$ substrate 10 is composed of the P$^+$ layer, the upper surface 14, including the P$^+$ gate regions 42, is uniformly joined in its entirely to the N$^-$ substrate 20. Because the P$^+$ region 26 is formed in the lower surface 24 of the N$^-$ substrate 20, the N$^-$ substrate 20 is well electrically connected to the N$^-$ substrate 10. It is possible to make the P$^+$ gate regions 42 of high concentration for increasing a maximum cutoff current.

According to this embodiment, the intergate P$^+$ regions 46 are formed between the P$^+$ gate regions 42 contiguously thereto, and the P$^+$ region 26 is disposed on the intergate P$^+$ regions 46. Therefore, even when no bias is applied to the gate, a depletion layer is continuously spread between the P$^+$ gate regions 42, so that the static induction thyristor 100 functions as a normally-off static induction thyristor.

(4th Embodiment)

FIGS. 10A through 10D are illustrative of a static induction thyristor according to a fourth embodiment of the present invention and a method of manufacturing the static entirety.

Figure 10A:
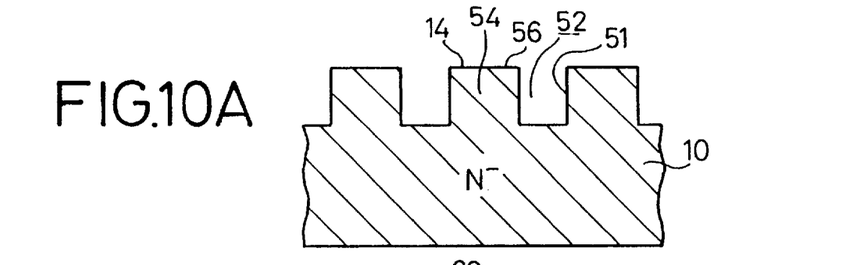
FIGS. 10A through 10D are fragmentary cross-sectional views showing a static induction thyristor according to a fourth embodiment of the present invention and a method of manufacturing the static induction thyristor according to the fourth embodiment.
Figure 10B:
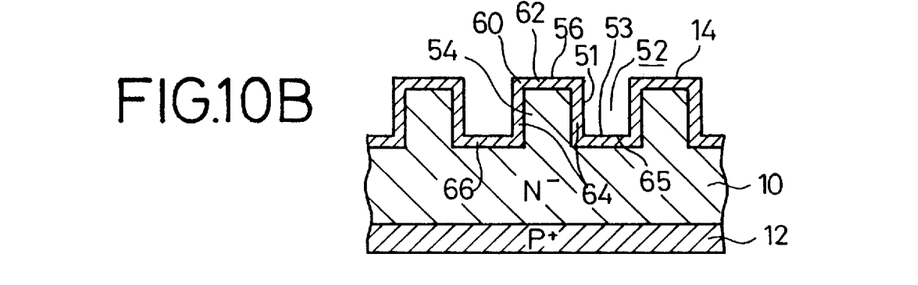

First, as shown in FIGS. 10A and 10B, recesses 52 are defined in an upper surface 14 of the N$^-$ substrate 10, leaving lands 54 between the recesses 52, a P$^+$ layer 12 is formed in a lower surface of the N$^-$ substrate 10 by diffusing an impurity therein, a P$^+$ region 60 is formed in the entire upper surface 14 of the N$^-$ substrate 10, whereupon P$^+$ side gate regions 64 and P$^+$ bottom gate regions 66 are formed in exposed regions of the N$^-$ substrate 10 on side walls 51 and bottoms 53 of the recesses 52, and intergate P$^+$ regions 62 are formed in exposed regions of the N$^-$ substrate 10 on upper surfaces 56 of the lands 54, in the same manner as with the second embodiment. The P$^+$ bottom gate regions 66, the P$^+$ side gate regions 64, and the intergate P$^+$ regions 62 are contiguous to each other. The P$^+$ side gate regions 64 and the P$^+$ bottom gate regions 66 jointly constitute P$^+$ gate regions 65.

Figure 10C:
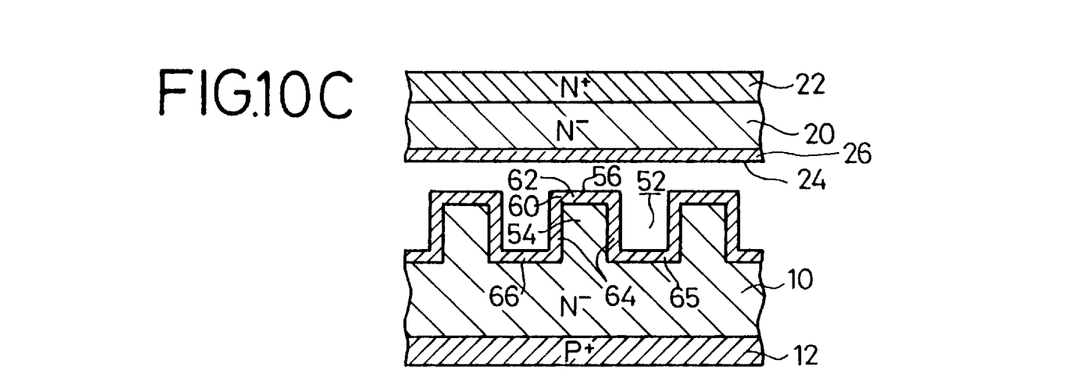

As shown in FIG. 10C, an N⁺ layer 22 is formed in an upper surface of the N⁻ substrate 20 by diffusing an impurity therein, and a P⁺ layer 26 is formed in an entire lower surface 24 of the N⁻ substrate 20 by diffusing an impurity therein.

Then, the N⁻ substrates 10, 20 are ultrasonically cleaned with an aqueous solution of sulfuric acid and hydrogen peroxide, thereby removing organic substances and metals.

Thereafter, the N⁻ substrates 10, 20 are cleaned with pure water, and dried by a spinner at room temperature.

Figure 10D:
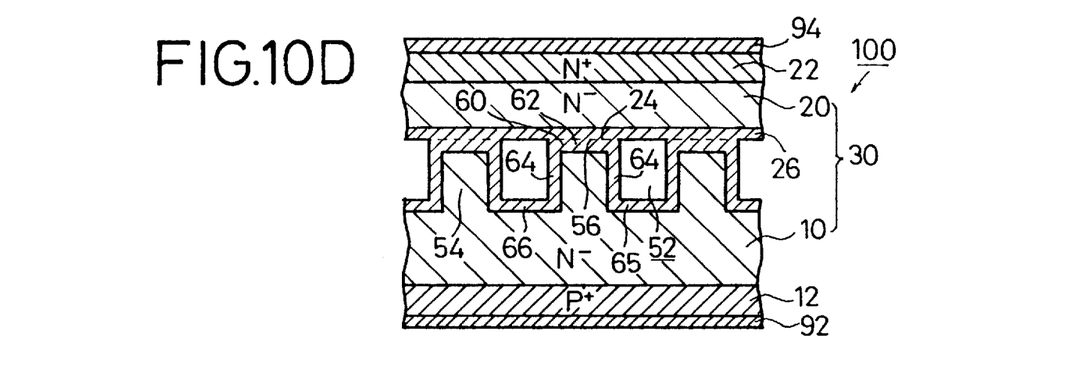

As shown in FIG. 10D, while the upper surfaces 56 of the lands 54 of the N⁻ substrate 10 between the recesses 52 and a lower surface 24 of the N⁻ substrate 20 are being held against each other, the N⁻ substrate 10 and the N⁻ substrate 20 are joined to each other by being heated at about 800° C. in a hydrogen atmosphere.

Then, an anode electrode 92 and a cathode electrode 94 are formed respectively on a lower surface of the P⁺ layer 12 formed in the lower surface of the N³¹ substrate 10 and an upper surface of the N⁺ layer 22 formed the upper surface of the N⁻ substrate 20, thus producing a static induction thyristor 100.

In the static induction thyristor 100, the P⁺ layer 12 functions as an anode, the N⁺ layer 22 as a cathode, both the N⁻ substrates 10, 20 as an N base 30, and the P⁺ gate regions 65 as a gate for controlling an anode current flowing between the anode electrode 92 and the cathode electrode 94.

In this embodiment, since the N base 30 in which the P⁺ gate regions 65 and the intergate P⁺ regions 62 embedded is formed by joining the N⁻ substrates 10, 20 to each other, the N base 30 has uniform, high-quality crystallinity. Because the P⁺ region 26 is formed in the lower surface 24 of the N⁻ substrate 20, the N⁻ substrate 20 is well electrically connected to the N⁻ substrate 10. It is possible to make the P⁺ gate regions 65 of high concentration for increasing a maximum cutoff current.

According to this embodiment, the intergate P⁺ regions 62 are formed between the P⁺ gate regions 65 contiguously thereto, and the P⁺ region 26 is disposed on the intergate P⁺ regions 62. Therefore, even when no bias is applied to the gate, a depletion layer is continuously spread between the gate regions 65, especially between the side gate regions 64, so that the static induction thyristor 100 functions as a normally-off static induction thyristor.

(5th Embodiment)

FIGS. 11A through 11D and 12A, 12B are illustrative of a static induction thyristor according to a fifth embodiment of the present invention and a method of manufacturing the static induction thyristor according to the fifth embodiment.

Figure 11A:
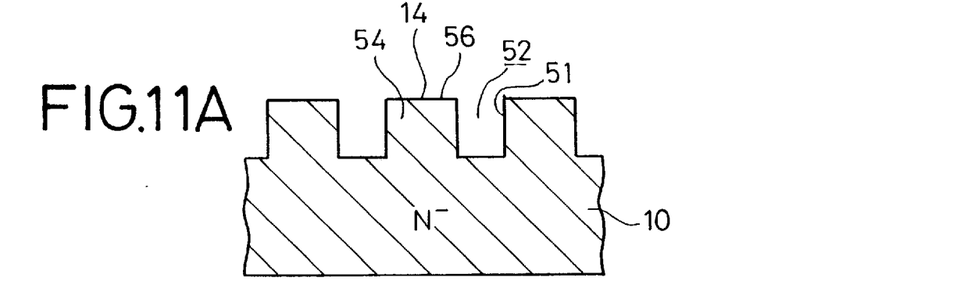
FIGS. 11A through 11D are fragmentary cross-sectional views showing static induction thyristors according to fifth and sixth embodiments of the present invention and a method of manufacturing the static induction thyristors according to the fifth and sixth embodiments.
Figure 11B:
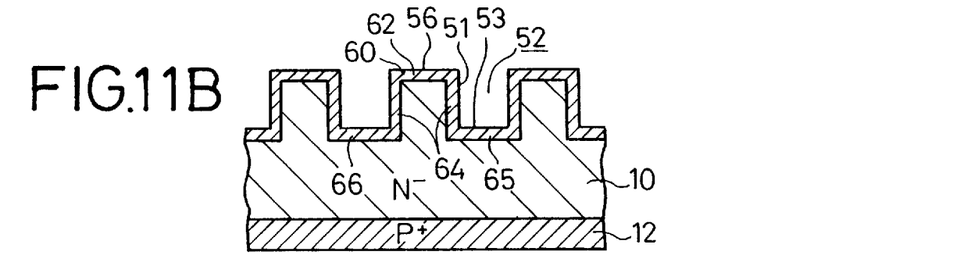

First, as shown in FIGS. 11A and 11B, recesses 52 are defined in an upper surface 14 of the N⁻ substrate 10, leaving lands 54 between the recesses 52, a P⁺ layer 12 is formed in a lower surface of the N⁻ substrate 10 by diffusing an impurity therein, a P⁺ region 60 is formed in the entire upper surface 14 of the N⁻ substrate 10, whereupon P+side gate regions 64 and P⁺ bottom gate regions 66 are formed in exposed regions of the N⁻ substrate 10 on side walls 51 and bottoms 53 of the recesses 52, and intergate P⁺ regions 62 are formed in exposed regions of the N⁻ substrate 10 on upper surfaces 56 of the lands 54, in the same manner as with the second embodiment. The P⁺ bottom gate regions 66, the P⁺ side gate regions 64, and the intergate P⁺ regions 62 are contiguous to each other. The P⁺ side gate regions 64 and the P⁺ bottom gate regions 66 jointly constitute P⁺ gate regions 65.

Figure 11C:
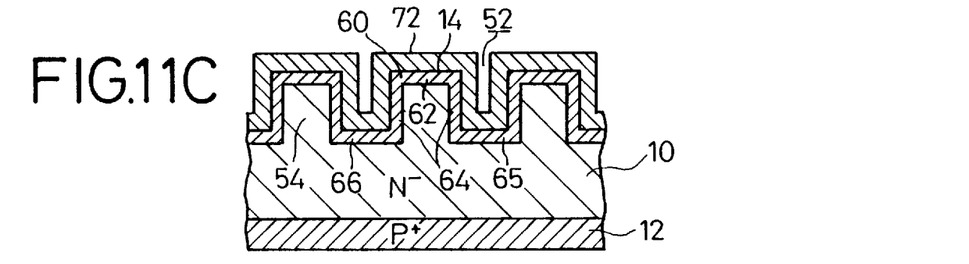

As shown in FIG. 11C, a gate electrode film 72 of tungsten having a film thickness of 0.3 μm is deposited on the entire upper surface 14 of the N⁻ substrate 10 by chemical vapor deposition.

Figure 11D:
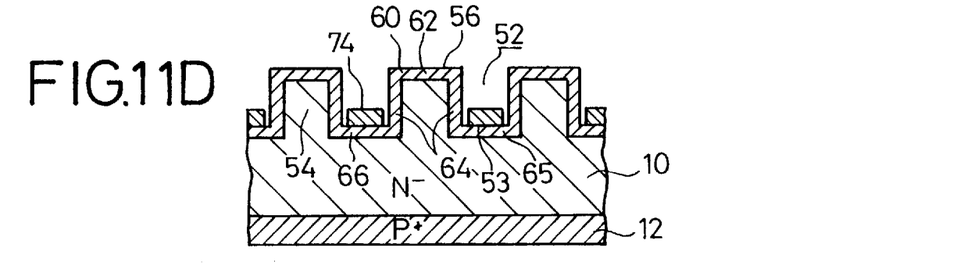

Then, as shown in FIG. 11D, the gate electrode film 72 is patterned into gate electrodes 74, each having a width of about 25 μm, in the respective recesses 52 on the bottom gate regions 66 according to photolithography.

Figure 12A:
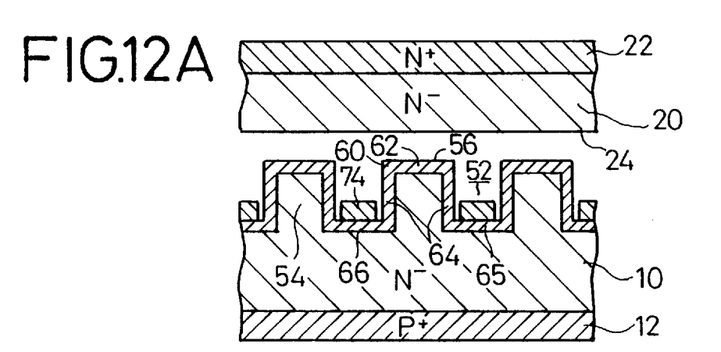
FIGS. 12A and 12B are fragmentary cross-sectional views showing the static induction thyristor according to the fifth embodiment and the method of manufacturing the static induction thyristor according to the fifth embodiment.

Thereafter, as shown in FIG. 12A, an N⁺ layer 22 is formed in an upper surface of the N⁻ substrate 20 by diffusing an impurity therein.

Then, the N⁻ substrates 10, 20 are ultrasonically cleaned with an aqueous solution of sulfuric acid and hydrogen peroxide, thereby removing organic substances and metals.

Thereafter, the N⁻ substrates 10, 20 are cleaned with pure water, and dried by a spinner at room temperature.

Figure 12B:
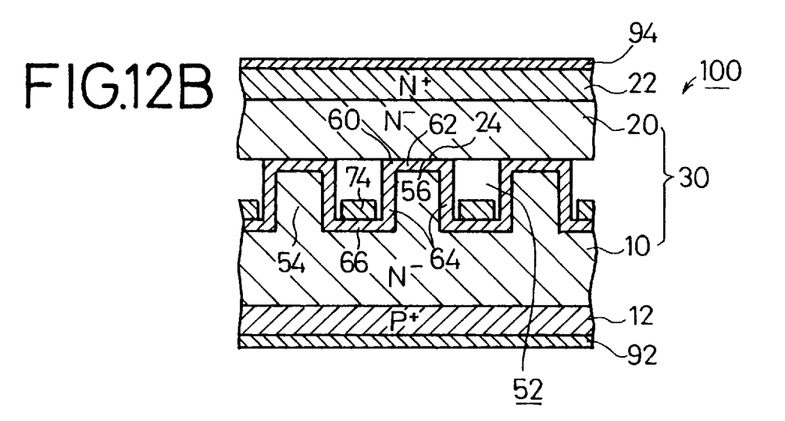

As shown in FIG. 12B, while the upper surfaces 56 of the lands 54 of the N⁻ substrate 10 between the recesses 52 and a lower surface 24 of the N⁻ substrate 20 are being held against each other, and the N⁻ substrate 10 the N⁻ substrate 20 are joined to each other by being heated at about 800° C. in a hydrogen atmosphere. If the gate electrodes 74 are made of aluminum, then the N⁻ substrate 10 and the N⁻ substrate 20 are joined to each other at about 400° C.

Then, an anode electrode 92 and a cathode electrode 94 are formed respectively on a lower surface of the P⁺ layer 12 formed in the lower surface of the N⁻ substrate 10 and an upper surface of the N⁺ layer 22 formed the upper surface of the N⁻ substrate 20, thus producing a static induction thyristor 100.

In the static induction thyristor 100, the P⁺ layer 12 functions as an anode, the N⁺ layer 22 as a cathode, both the N⁻ substrates 10, 20 as an N base 30, and the P⁺ gate regions 65 as a gate for controlling an anode current flowing between the anode electrode 92 and the cathode electrode 94.

In this embodiment, since the N base 30 in which the P⁺ gate regions 65 and the intergate P⁺ regions 62 embedded is formed by joining the N⁻ substrates 10, 20 to each other, the N base 30 has uniform, high-quality crystallinity. It is possible to make the P⁺ gate regions 65 of high concentration for increasing a maximum cutoff current.

According to this embodiment, the intergate P⁺ regions 62 are formed between the P⁺ gate regions 65 contiguously thereto. Therefore, even when no bias is applied to the gate, a depletion layer is continuously spread between the gate regions 65, especially between the side gate regions 64, so that the static induction thyristor 100 functions as a normally-off static induction thyristor.

According to this embodiment, since the gate electrodes 74 of tungsten are disposed on the bottom gate regions 66, the resistance of the gate in a lateral direction is reduced to increase the maximum cutoff current, and a carrier drawing current is increased for higher-speed switching.

Because the gate electrodes 74 are already accommodated in the recesses 52 in the N⁻ substrate 10 before the N⁻ substrates 10, 20 are joined to each other, it is not necessary to define grooves of a large aspect ratio in the N⁺ layer 22 and the N⁻ substrate 20 for the formation of the gate electrodes 74 therein. The N⁺ layer 22 and the N⁻ substrate 20 do not have a high resistance which would otherwise result if they were divided into small strips by such grooves.

Since the recesses 52 defined in the upper surface of the N⁻ substrate 10 are small enough to accommodate the gate electrodes 74, it is not time-consuming to define the recesses 52 in the upper surface of the N⁻ substrate 10.

The gate electrodes 74 are accommodated in the recesses 52 in the N⁻ substrate 10. Therefore, it is not necessary to define recesses in the lower surface 24 of the N⁻ substrate 20 which is joined to the lands 54 on the upper surface of the N⁻ substrate 10, and hence the lower surface 24 may remain flat. Consequently, no special registration process is required for joining the lands 54 on the upper surface of the N⁻ substrate 10 and the lower surface 24 of the N⁻ substrate 20 to each other, and the static induction thyristor 100 can be manufactured relatively easily.

(6th Embodiment)

FIGS. 11A through 11D and 13A, 13B are illustrative of a static induction thyristor according to a sixth embodiment of the present invention and a method of manufacturing the static induction thyristor according to the sixth embodiment.

First, as with the fifth embodiment shown in FIGS. 11A through 11D, recesses 52 are defined in an upper surface 14 of the N⁻ substrate 10, leaving lands 54 between the recesses 52, a P⁺ layer 12 is formed in a lower surface of the N⁻ substrate 10 by diffusing an impurity therein, a P⁺ region 60 is formed in the entire upper surface 14 of the N⁻ substrate 10, whereupon P⁺ side gate regions 64 and P⁺ bottom gate regions 66 are formed in exposed regions of the N⁻ substrate 10 on side walls 51 and bottoms 53 of the recesses 52, and intergate P⁺ regions 62 are formed in exposed regions of the N⁻ substrate 10 on upper surfaces 56 of the lands 54. The P⁺ bottom gate regions 66, the P⁺ side gate regions 64, and the intergate P⁺ regions 62 are contiguous to each other. The P⁺ side gate regions 64 and the P⁺ bottom gate regions 66 jointly constitute P⁺ gate regions 65. Gate electrodes 74 of tungsten are selectively formed on the bottom gate regions 66 in the recesses 52.

Figure 13A:
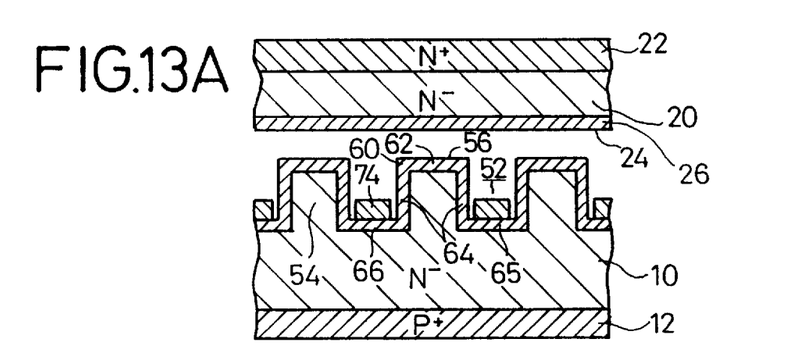
FIGS. 13A and 13B re fragmentary cross-sectional views showing the static induction thyristor according to the sixth embodiment and the method of manufacturing the static induction thyristor according to the sixth embodiment.

Thereafter, as shown in FIG. 13A, an N⁺ layer 22 is formed in an upper surface of the N⁻ substrate 20 by diffusing an impurity therein, and a P⁺ layer 26 is formed in an entire lower surface 24 of the N⁻ substrate 20 by diffusing an impurity therein.

Then, the N⁻ substrates 10, 20 are ultrasonically cleaned with an aqueous solution of sulfuric acid and hydrogen peroxide, thereby removing organic substances and metals.

Thereafter, the N⁻ substrates 10, 20 are cleaned with pure water, and dried by a spinner at room temperature.

Figure 13B:
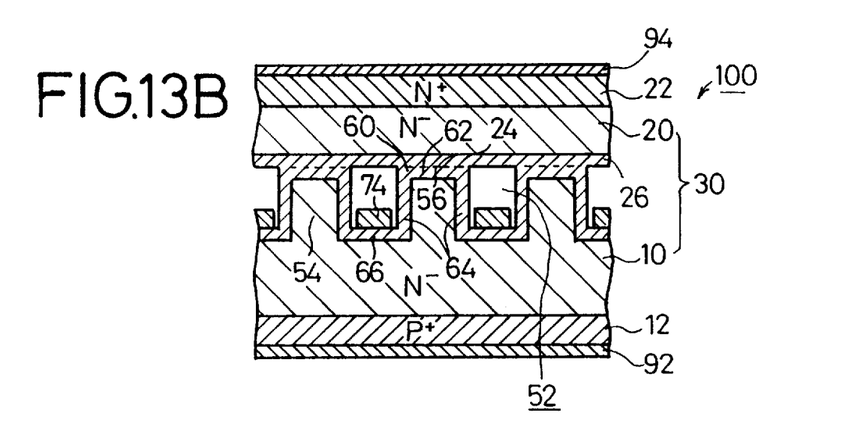

As shown in FIG. 13B, while the upper surfaces 56 of the lands 54 of the N⁻ substrate 10 between the recesses 52 and a lower surface 24 of the N⁻ substrate 20 are being held against each other, and the N⁻ substrate 10 and the N⁻ substrate 20 are joined to each other by being heated at about 800° C. in a hydrogen atmosphere.

Then, an anode electrode 92 and a cathode electrode 94 are formed respectively on a lower surface of the P⁺ layer 12 formed in the lower surface of the N⁻ substrate 10 and an upper surface of the N⁺ layer 22 formed the upper surface of the N⁻ substrate 20, thus producing a static induction thyristor 100.

In the static induction thyristor 100, the P⁺ layer 12 functions as an anode, the N⁺ layer 22 as a cathode, both the N⁻ substrates 10, 20 as an N base 30, and the P⁺ gate regions 65 as a gate for controlling an anode current flowing between the anode electrode 92 and the cathode electrode 94.

In this embodiment, since the N base 30 in which the P⁺ gate regions 65 and the intergate P⁺ regions 62 embedded is formed by joining the N⁻ substrates 10, 20 to each other, the N base 30 has uniform, high-quality crystallinity. Because the P⁺ region 26 is formed in the lower surface 24 of the N⁻ substrate 20, the N⁻ substrate 20 is well electrically connected to the N⁻ substrate 10.

According to this embodiment, the intergate P⁺ regions 62 are formed between the P⁺ gate regions 65 contiguously thereto, and the P⁺ region 26 is disposed on the intergate P⁺ regions 62. Therefore, even when no bias is applied to the gate, a depletion layer is continuously spread between the gate regions 65, especially between the side gate regions 64, so that the static induction thyristor 100 functions as a normally-off static induction thyristor.

According to this embodiment, since the gate electrodes 74 of tungsten are disposed on the bottom gate regions 66, the resistance of the gate in a lateral direction is reduced to increase the maximum cutoff current, and a carrier drawing current is increased for higher-speed switching.

While the gate electrodes 74 are made of tungsten in the fifth and sixth embodiments, the gate electrodes 74 may be made of a metal of high melting point, such as molybdenum or the like, or polycrystalline silicon doped with an impurity of boron or the like, or aluminum or the like.

In the method according to the present invention, first and second semiconductor substrates of one conductivity type are prepared, gate regions of a semiconductor of another conductivity type are formed in one principal surface of the first semiconductor substrate, then first semiconductor regions of the other conductivity type are formed on the one principal surface of the first semiconductor substrate between the gate regions, after which the one principal surface of the first semiconductor substrate between the gate regions and one principal surface of a second semiconductor substrate are joined to each other. With this arrangement, a base having uniform, high-quality crystallinity is obtained.

Since the first semiconductor regions of the same conductivity type as the gate regions are formed between the gate regions, a normally-off static induction thyristor is easily manufactured.

If the gate regions are disposed in regions of the first semiconductor substrate which are exposed on side walls of recesses defined in the one principal surface of the first semiconductor substrate, then a semiconductor device is manufactured which has a high dielectric strength when turned off, suffers a low leakage current, has an excellent cutoff capability, and is capable of controlling a large current. As a result, a yield can be increased at the time the recesses are defined in a fine pattern in the one principal surface of the first semiconductor substrate. The cross-sectional area of the first semiconductor substrate between the recesses is prevented from being reduced, lowering the resistance of the first semiconductor substrate between the recesses. As a result, the voltage across the semiconductor device when it is turned on is lowered, allowing the semiconductor device to handle a large current.

If the gate regions of the other conductivity type are also disposed in regions of the first semiconductor substrate which are exposed on bottoms of recesses defined in the one principal surface of the first semiconductor substrate, then the resistance of the gate in a lateral direction is reduced to increase the maximum cutoff current, and the semiconductor device can operate in a high frequency range.

If a second semiconductor region of the other conductivity type is formed on the one principal surface of the second semiconductor substrate and thereafter the one principal surface of the first semiconductor substrate between the gate regions and the one principal surface of the second semiconductor substrate are joined to each other, then they are well electrically connected to each other.

If gate electrodes of a good conductor electrically connected to the gate regions are disposed in the recesses defined in the one principal surface of the first semiconductor substrate and thereafter the one principal surface of the first semiconductor substrate and the one principal surface of the second semiconductor substrate are joined to each other, then the resistance of the gate in a lateral direction is reduced to increase the maximum cutoff current, and a carrier drawing current is increased for higher-speed switching.

Since the gate electrodes are already accommodated in the recesses in the first semiconductor substrate before the one principal surface of the first semiconductor substrate and the one principal surface of the second semiconductor substrate are joined to each other, it is not necessary to define grooves of a large aspect ratio in the semiconductor substrate for the formation of the gate electrodes therein. The semiconductor substrate above the gate electrodes does not have a high resistance which would otherwise result if it were divided into small strips by such grooves.

Since the recesses defined in the one principal surface of the first semiconductor substrate are small enough to accommodate the gate electrodes, it is not time-consuming to define the recesses according to a dry etching process with a low etching rate.

The gate electrodes are accommodated in the recesses in the one principal surface of the first semiconductor substrate. Therefore, it is not necessary to define recesses in the one principal surface of the second semiconductor substrate which is joined to the one principal surface of the first semiconductor substrate, and hence the one principal surface of the second semiconductor substrate may remain flat. Consequently, no special registration process is required for joining the one principal surface of the first semiconductor substrate and the one principal surface of the second semiconductor substrate to each other, and the semiconductor device can be manufactured relatively easily.

The semiconductor device according to the present invention has a gate disposed in a semiconductor substrate between anode and cathode electrodes for controlling a current flowing between the anode and cathode electrodes, the semiconductor substrate having cavities defined therein and gate regions of a semiconductor which are disposed in regions exposed on side walls of the cavities. Consequently, the semiconductor device has a high dielectric strength when turned off, suffers a low leakage current, has an excellent cutoff capability, and is capable of controlling a large current. Even if the interval between the gate regions is not reduced, the semiconductor device is given desired characteristics, and it is not necessary to reduce the distance between the cavities in the semiconductor substrate. As a consequence, a yield can be increased at the time the cavities are defined in a fine pattern in the semiconductor substrate. Since it is not necessary to reduce the distance between the cavities, the cross-sectional area of the semiconductor substrate between the cavities is prevented from being reduced, and the resistance of the semiconductor substrate between the cavities is lowered, with the results that the voltage across the semiconductor device when it is turned on is lowered, and the semiconductor device can handle a large current.

The semiconductor device has a semiconductor region of the same conductivity type as the gate regions, which is disposed between the gate regions such that a depletion layer is continuously spread between the gate regions when no bias is applied to the gate. The semiconductor device thus arranged functions as a normally-off semiconductor device.

With the semiconductor region being contiguous to the gate regions, a depletion layer is more reliably continuously spread between the gate regions when no bias is applied to the gate.

If the side walls of the cavities extend substantially parallel to the direction of the current flowing between the anode and cathode electrodes, then the semiconductor device has a higher dielectric strength when turned off, suffers a lower leakage current, has a more excellent cutoff capability, and is capable of controlling a larger current. Inasmuch as the distance between the cavities in the semiconductor substrate can be increased, a yield can be increased to a greater degree at the time the cavities are defined in a fine pattern in the semiconductor substrate. The cross-sectional area of the semiconductor substrate between the cavities can be increased, and the resistance of the semiconductor substrate between the cavities can be further lowered, with the results that the voltage across the semiconductor device when it is turned on can be further lowered, and the semiconductor device can handle a larger current.

If the gate regions are also disposed on regions exposed on bottoms of the cavities in the semiconductor substrate, then the resistance of the gate in a lateral direction is reduced to increase the maximum cutoff current, and the semiconductor device can operate in a high frequency range.

If gate electrodes of a good conductor electrically connected to the gate regions are disposed in the cavities defined in the semiconductor substrate, then the resistance of the gate in a lateral direction is reduced to increase the maximum cutoff current, and a carrier drawing current is increased for higher-speed switching.

Although certain preferred embodiments of the present invention have been shown and described in detail, it should be understood that various changes and modifications may be made therein without departing from the scope of the appended claims.

What is claimed is:

1. A semiconductor device comprising an anode electrode;
    a cathode electrode;
    a semiconductor substrate disposed between said anode electrode and said cathode electrode and comprising first and second semiconductor layers;
    a gate disposed in said first semiconductor layer for controlling a current flowing between said anode electrode and said cathode electrode;
    said first semiconductor layer having cavities defined therein;
    said second semiconductor layer disposed over said cavities in said first semiconductor layer:
    gate regions of a semiconductor disposed on regions of said first semiconductor layer which are exposed on side walls of said cavities, thereby allowing an anode current to flow along said side walls; and
    a semiconductor region of the same conductivity type as said gate regions, which is disposed between said gate regions, forming intergate regions between the gate regions in respective adjacent cavities, such that a depletion layer is continuously spread between said gate regions when no bias is applied to said gate.

2. A semiconductor device according to claim 1, wherein said semiconductor region is contiguous to said gate regions.

3. A semiconductor device according to claim 1 or 2, wherein said side walls of said cavities extend substantially in parallel to a direction of current flow between said anode electrode and said cathode electrode.

4. A semiconductor device according to claim 1, further comprising gate regions disposed on regions of said semiconductor substrate which are exposed on bottoms of said cavities.

5. A semiconductor device according to claim 1, further comprising gate electrodes of a good conductor which are electrically connected to said gate regions, said gate electrodes being disposed in said cavities.

6. A semiconductor device according to claim 1, wherein said semiconductor substrate comprises a third semiconductor layer of one conductivity type, said first and second semiconductor layers which are of an other conductivity type and disposed on said third semiconductor layer, and a fourth semiconductor layer of said other conductivity type having a higher impurity concentration than said first and second semiconductor layers, one of said anode electrode and said cathode electrode being electrically connected to said third semiconductor layer, the other of said anode electrode and said cathode electrode being electrically connected to said fourth semiconductor layer, said gate regions and said semiconductor region being made of a semiconductor of said one conductivity type, said cavities, said gate regions, and said semiconductor region being disposed in said first semiconductor layer.

* * * * *